(12) United States Patent
Kasturi et al.

(10) Patent No.: US 10,269,716 B2
(45) Date of Patent: Apr. 23, 2019

(54) DEVICE, SYSTEM AND METHOD TO INTERCONNECT CIRCUIT COMPONENTS ON A TRANSPARENT SUBSTRATE

(71) Applicant: Intel Corporation, Santa Clara, CA (US)

(72) Inventors: Vijay Kasturi, Hillsboro, OR (US); Ana M. Yepes, Hillsboro, OR (US); Chung-Hao Chen, Portland, OR (US); Bradley A. Jackson, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/201,337

(22) Filed: Jul. 1, 2016

(65) Prior Publication Data

US 2018/0005947 A1    Jan. 4, 2018

(51) Int. Cl.
*H01L 23/538* (2006.01)
*H01L 21/48* (2006.01)
*H01L 23/15* (2006.01)

(52) U.S. Cl.
CPC ...... *H01L 23/5385* (2013.01); *H01L 21/4853* (2013.01); *H01L 21/4857* (2013.01); *H01L 23/15* (2013.01); *H01L 23/5387* (2013.01); *H01L 2224/16225* (2013.01)

(58) Field of Classification Search
CPC ............ H01L 23/5385; H01L 21/4853; H01L 21/4857; H01L 23/5387; H01L 23/15; H01L 2224/16225
See application file for complete search history.

(56) References Cited

U.S. PATENT DOCUMENTS

| | | | |
|---|---|---|---|
| 6,683,377 B1 | 1/2004 | Shim et al. | |
| 2002/0076919 A1* | 6/2002 | Peters | H01L 23/49822 438/637 |
| 2005/0280138 A1 | 12/2005 | Shrivastava et al. | |
| 2011/0233783 A1 | 9/2011 | Lim et al. | |

(Continued)

FOREIGN PATENT DOCUMENTS

KR    10-2005-0029213    3/2005

OTHER PUBLICATIONS

PCT Application PCT/US2017/033382, International Search Report and Written Opinion dated Sep. 21 2017, 12 pgs.

*Primary Examiner* — Latanya N Crawford
(74) *Attorney, Agent, or Firm* — Womble Bond Dickinson (US) LLP

(57) ABSTRACT

Techniques and mechanisms for interconnecting circuitry disposed on a transparent substrate. In an embodiment, a multilayer circuit is bonded to the transparent substrate, the multilayer circuit including conductive traces that are variously offset at different respective levels from a side of the transparent substrate. Circuit components, such as packaged or unpackaged integrated circuit devices, are coupled each to respective input and/or output (IO) contacts of the multilayer circuit, where the conductive traces and the IO contacts interconnect the circuit components with each other. In another embodiment, the multilayer circuit is a flexible circuit that is bent to interconnect circuit components which are disposed on opposite respective sides of the transparent substrate.

13 Claims, 9 Drawing Sheets

(56) References Cited

U.S. PATENT DOCUMENTS

2011/0267534 A1* 11/2011 Tsai .................. H04N 5/2253
                                                              348/374
2012/0222889 A1*  9/2012 Davis ................. C08G 18/345
                                                              174/254
2014/0246687 A1    9/2014 Ha et al.

* cited by examiner

DEVICE, SYSTEM AND METHOD TO INTERCONNECT CIRCUIT COMPONENTS ON A TRANSPARENT SUBSTRATE

BACKGROUND

1. Technical Field

Embodiments of the present invention relate to the field of integrated circuit devices, and more particularly, to the interconnection of circuit components on a transparent substrate.

2. Background Art

Successive generations of processors, microcontrollers, drivers and other microelectronic devices continue to scale in size, while supporting increasing levels of computation and input/output (IO) capability. These advancements pose new challenges at least with respect to effective interconnection and communication of components with each other. One area where these challenges are faced is Chip-on-Glass (COG) technology, which is often used for smartphone and small tablet display solutions.

COG technologies typically bond unpackaged (bare die) integrated circuit (IC) components directly onto a display glass, where the IC components operate to control display functionality. A common interconnect technique for COG is to couple components at opposite ends of traces that are printed on a glass surface. However, these printed traces, which usually comprise Indium Tin Oxide (ITO), are prone to signal degradation problems. As a result, the distances of printed interconnects in COG systems tend to be somewhat limited (typically not more than a few millimeters). The number and variety of COG systems continues to grow with increasing demand for wearables, smartphones, tablets and the like. Due to this growth, there is expected to be an increasing premium placed on improvements to the interconnection of components in COG systems.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide mechanisms and/or techniques to facilitate communication between circuit components that are coupled to or otherwise disposed, directly or indirectly, on a transparent substrate. In an embodiment, a device (referred to herein as a "multilayer circuit") is bonded to a transparent substrate—e.g., bonded at a side of the transparent substrate—where the device includes conductive traces that are variously offset at different respective levels from a side of the transparent substrate. For example, such traces may extend through an insulating dielectric of the multilayer circuit, wherein the dielectric is adhered directly to at least one side of a glass, plastic or other transparent substrate. In one embodiment, the multilayer circuit is flexible (e.g., at least prior to being bonded at a glass surface) and may bend around an edge of a substrate to interconnect components on opposite sides of that substrate.

Although some embodiments are not limited in this regard, a multilayer circuit may function as a bridge between ITO traces (or other such interconnect structures) that are variously patterned on one or more substrate surfaces. As compared to ITO traces, traces of the multilayer circuit in an embodiment may exhibit better signal communication characteristics—e.g., due to trace materials and/or dimensions, electromagnetic shielding provided by the multilayer circuit and/or the like. Due in part to such characteristics, some embodiments allow for signaling via multilayer circuit traces that are relatively long (e.g., 1 cm or more)—e.g., as compared to the length of printed ITO traces used in existing COG interconnect solutions.

Figure 1:
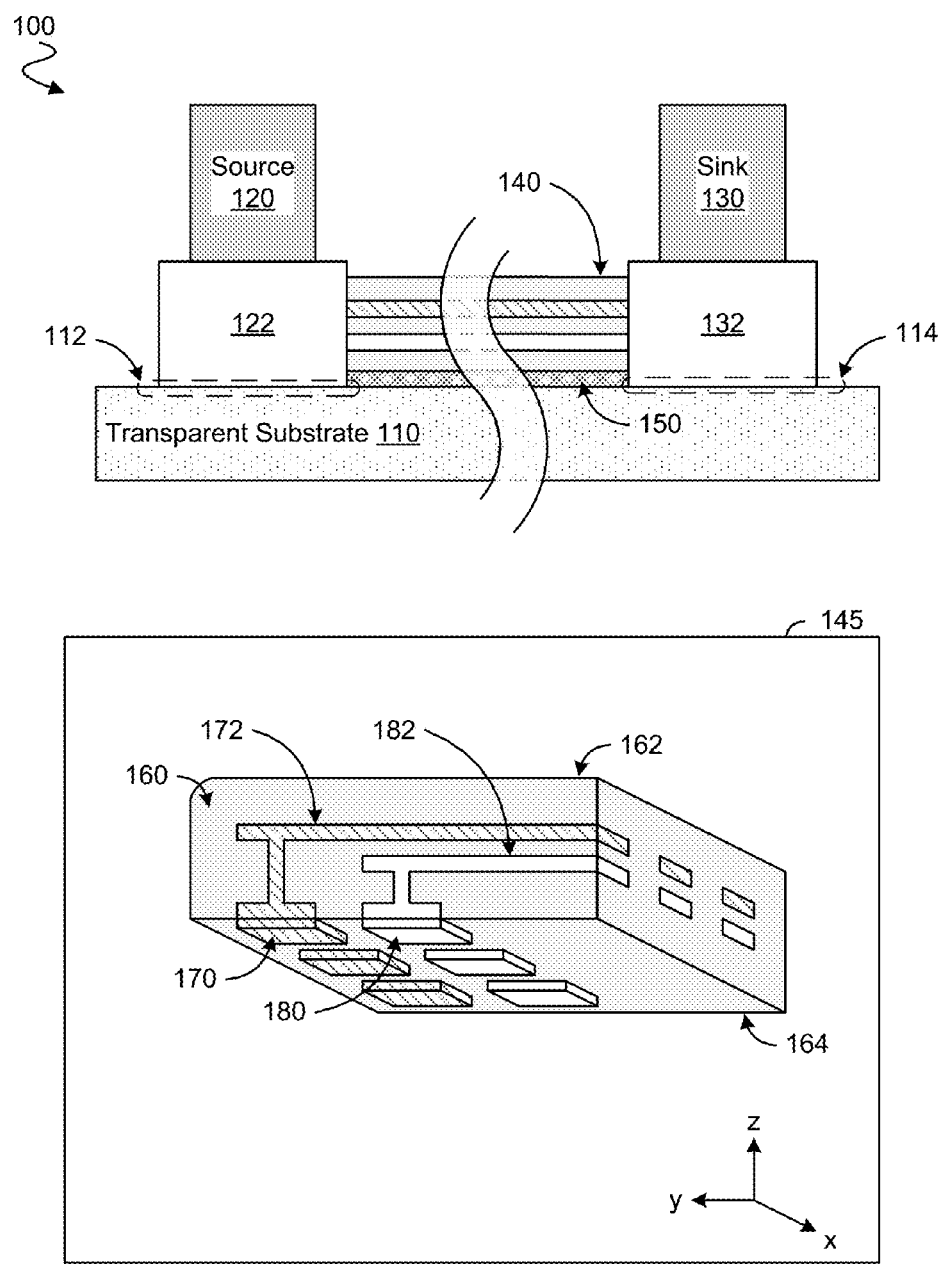
FIG. 1 shows cross-sectional views of a system to interconnect circuitry on a transparent substrate according to an embodiment.

FIG. 1 illustrates elements of a system 100 to provide coupling between circuit components according to an embodiment. System 100 is one example of an embodiment wherein interconnect structures are bonded to at least one surface of a transparent substrate. Certain features of various embodiments are described herein with reference to interconnect structures of a chip-on-glass system including microelectronic devices variously coupled to a glass substrate. However, such description may be extended to additionally or alternatively apply to interconnect structures bonded to any of a variety of other transparent substrates.

In the illustrative embodiment shown, system 100 includes transparent substrate 110 and a source 120 and sink 130 each coupled to a respective surface portions 112, 114 of transparent substrate 110. Surface portions 112, 114 may be on the same side of transparent substrate 110 or, for example, on opposite respective sides of transparent substrate 110. Source 120 represents any of a variety of microelectronic devices that may create, relay or otherwise provide one or more signals or voltages to be communicated along a surface of transparent substrate 110. By way of illustration and not limitation, source 120 may include an unpackaged (or packaged) microelectronic device such as a processor, controller, memory device, system-on-chip and/or the like. Correspondingly, sink 130 may include any of a variety of microelectronic devices configured to receive such voltages and/or signals from source 120. In one illustrative embodiment, sink 130 is a device to drive elements of a light emitting diode (LED)—e.g., organic LED (OLED)—display or other type of display device.

System 100 may include a multilayer circuit 140 to facilitate communication between source 120 and sink 130—e.g., wherein interconnect structures 122 provides connectivity between source 120 and multilayer circuit 140 and wherein interconnect structures 132 provide connectivity between sink 130 and multilayer circuit 140. In one embodiment, interconnect structures 122 include one or more conductive traces directly deposited on a transparent media of transparent substrate 110—e.g., wherein the one or more traces include patterned ITO structures variously extending each from a respective input and/or output (IO) contact of source 120 to a corresponding IO contact of multilayer circuit 140. Alternatively or in addition, interconnect structures 132 may include one or more such traces—e.g., including one or more ITO traces variously coupling IO contacts of sink 130 each to a corresponding IO contact of multilayer circuit 140.

In an embodiment, multilayer circuit 140 includes an insulating dielectric that is soldered, adhered and/or otherwise bonded to one or more surfaces of transparent substrate 110 (e.g., via the illustrative adhesive 150 shown). For example, the cross-sectional perspective view shown at inset 145 illustrates one example implementation of multilayer circuit 140 in an embodiment. As shown in inset 145, multilayer circuit 140 may include dielectric body 160 comprising a polyamide-imide (PAI) compound and/or any of a variety of other insulator materials. Interconnect structures, such as the illustrative traces 172, 182 shown, may be variously disposed between opposing sides 162, 164 of dielectric body 160 some or all such interconnect structures may variously include or extend to (or otherwise be coupled to) respective IO structures variously disposed each at a respective one of sides 162, 164. In the illustrative embodiment shown, trace 172 includes or couples to a via structure that extends to a contact 170 at side 164—e.g., wherein trace 182 includes or couples to another via structure extending to a contact 180 at side 164. In such an embodiment, interconnect structures may be variously disposed at different respective levels of dielectric body 160. By way of illustration and not limitation, trace 172 may extend to communicate a signal or voltage in parallel with the x-y plane shown, wherein trace 182 is to communicate another signal or voltage substantially along a second plane in parallel with the first plane. In such an embodiment, trace 172 may be at a height (along the z-axis shown) which is different than that of trace 182—wherein trace 172 is closer to side 162 than is trace 182. In one example embodiment, trace 172 is to communicate a reference potential (for example a ground signal) that contributes to shielding that protects signal integrity of a communication sent via trace 182. Dielectric body 160 may include more, fewer and/or differently arranged interconnect structures formed therein, in different embodiments.

Figure 2:
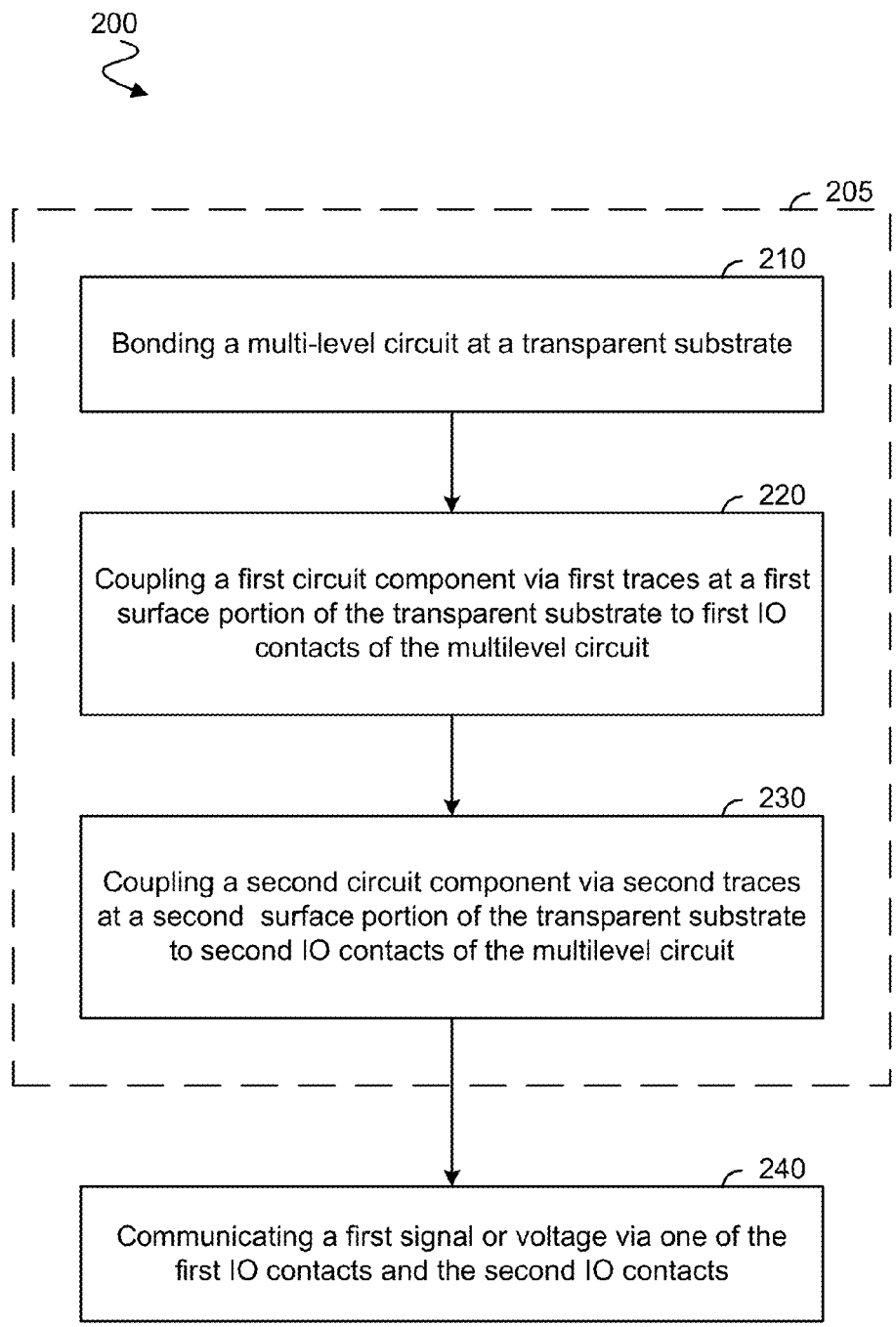
FIG. 2 is a flow diagram illustrating elements of a method for interconnecting circuitry according to an embodiment.

FIG. 2 illustrates operations of a method 200 to facilitate connectivity via circuit structures on a transparent substrate according to an embodiment. Method 200 may include operations to manufacture and/or operate having features such as those of system 100. For example, operations 205 of method 200 may provide for coupling of a circuit component to another such circuit component via a multilayer circuit.

In an embodiment, operations 205 include, at 210, bonding the multilayer circuit at the transparent substrate. The bonding at 210 may include adhering a first end of multilayer circuit to—e.g., with an anisotropic conductive film (ACF)—a first portion of a surface of the transparent substrate (for brevity, "first surface portion"). Such bonding may further comprise adhering a second end of the multilayer circuit to a second surface portion of the transparent substrate—e.g., wherein the first end and the second end are opposite respective ends of a flexible circuit. The bonding at 210 may include any of a variety of adhesive materials adapted from conventional COG techniques for securing components to a transparent substrate.

Although some embodiments are not limited in this regard, the first surface portion and the second surface portion may be on different respective sides—e.g., opposite sides—of the transparent substrate. In one embodiment, the first IO contacts and the second IO contacts are electrically coupled to one another—e.g., wherein a signal trace of the multilayer circuit is directly coupled to each of a respective one of the first IO contacts and a respective one of the second IO contacts. In another embodiment, one of the first IO contacts and one of the second IO contacts are coupled each to a different respective one of other IO contacts of the multilayer circuit. For example, the multilayer circuit may accommodate coupling to another device via such other IO contacts, wherein the other device—e.g., including a passive circuit element and/or active circuitry—is thereby coupled between the first IO contacts and the second IO contacts.

In some embodiments, operations 205 further include, at 220, coupling a first circuit component (e.g., including a first IC die or other microelectronic device) via first traces at a first surface portion of the transparent substrate to first IO contacts of the multilayer circuit. Similarly, operations 205 may include, at 230, coupling a second circuit component (e.g., including a second IC die or other microelectronic device) via second traces at a second surface portion of the transparent substrate to second IO contacts of the multilayer circuit. The coupling at 220, 230 may interconnect the first circuit component and the second circuit component with one another, and may include bonding a circuit component directly to a transparent substrate. For example, the bonding at 220, 230 may include bonding IO contacts of the circuit component to IO contacts of the multilayer circuit with ACF or other such conductive adhesive material. Although some embodiments are not limited in this regard, method 200 may additionally or alternatively include operations of a device that is manufactured at least in part by operations 205. For example, method 200 may further comprise, at 240, communicating a first signal or voltage via one of the first IO contacts and the second IO contacts. The communicating at 240 may include communicating a signal or voltage between the first circuit component and the second circuit component.

Figure 3:
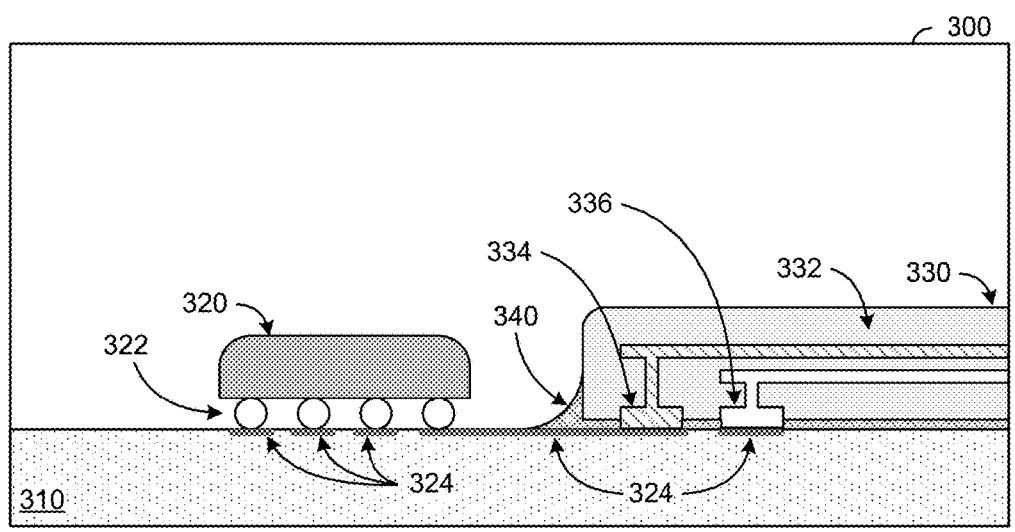
FIG. 3 shows a cross-sectional side view of a system to interconnect circuitry according to an embodiment.

FIG. 3 shows a cross sectional side view of a system 300 to provide interconnect structures on a transparent substrate according to an embodiment. System 300 may include features of system 100, for example. Manufacture and/or operation of system 300 may be according to method 200.

In the illustrative embodiment of system 300, a multilayer circuit 330 is bonded to a surface portion of a transparent substrate 310 via the illustrative adhesive 340 shown (e.g., the adhesive 340 including an ACF). Multilayer circuit 330 may include dielectric 332 (e.g., comprising a flexible dielectric material such as PAI) and layers of metallization extending therein. By way of illustration and not limitation, IO contacts 334, 336 of multilayer circuit 330 may each be coupled to a different respective conductive trace within dielectric 332. Such traces may each extend along different respective ones of parallel planes at various offsets from a surface of transparent substrate 310.

In an embodiment, system 300 further comprises, or is to couple to, a microelectronic device 320 that is to operate with multilayer circuit 330. For example, conductive traces 324 (e.g., ITO traces) may be disposed on the surface of transparent substrate 310, the traces 324 to variously couple contacts 334, 336 each to a respective one of hardware interface 322 of microelectronic device 320. Hardware interface 322 may include conductive bumps, balls, pads or other such contacts that, for example, are coupled to respective ones of traces 324 via an ACF or other such adhesive (not shown). Microelectronic device 320 may comprise one or more IC dies which, for example, are to provide processor, controller, memory and/or other functionality. However, some embodiments are not limited with respect to a particular functionality that may be provided by microelectronic device 320. In an embodiment, multilayer circuit 330 is to facilitate connectivity of microelectronic device 320 to another microelectronic device (not shown) that is adhered and/or otherwise bonded—directly or indirectly—to transparent substrate 310.

Figure 4:
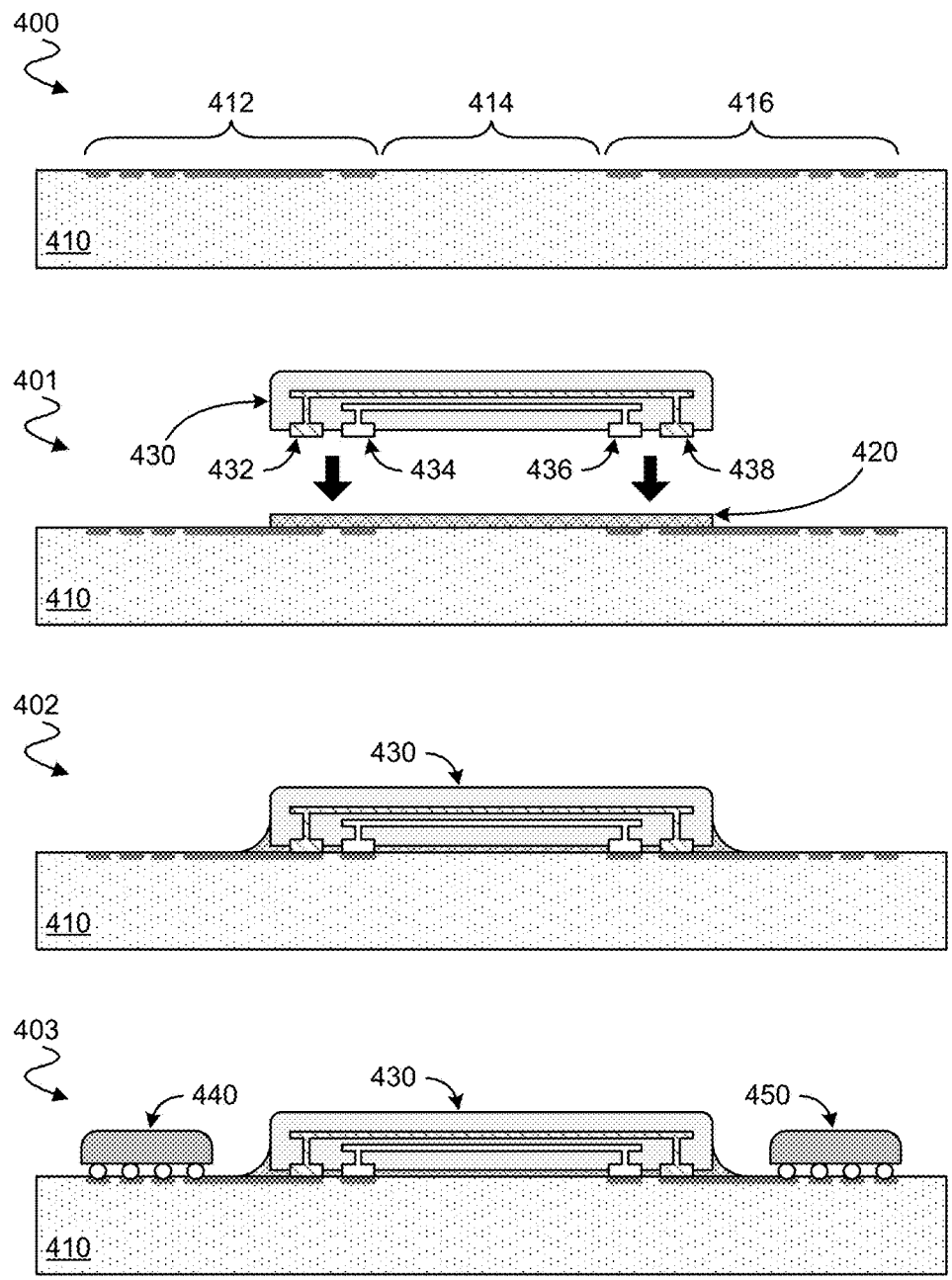
FIG. 4 shows cross-sectional side views of processing to interconnect circuitry with a multilayer circuit according to an embodiment.

FIG. 4 illustrates stages 400-403 of processing to interconnect circuitry on a transparent substrate according to an embodiment. The processing illustrated by stages 400-403 may be according to method 200, for example. In an embodiment, such processing may interconnect structures of system 100, system 300 or the like. The particular order by which devices are variously coupled to one another during stages 400-403 is merely illustrative, and may be different in other embodiments.

As shown at stage 400, a transparent substrate 410 may include surface portions 412, 416 and another surface portion 414 between surface portions 412, 416. In the illustrative embodiment shown, surface portions 412, 414, 416 are all on the same side of transparent substrate 410. However, other embodiments are not limited in this regard. Surface portions 412, 416 may have respective conductive traces (e.g., comprising patterned ITO) variously disposed thereon. Surface portion 414 may facilitate coupling of a multilayer circuit to transparent substrate 410, the multilayer circuit to variously interconnect such traces with one another.

For example, as shown at stage 401, an adhesive 420 may be deposited on surface portion 414 and a multilayer circuit 430 aligned over surface portion 414 and adhesive 420. Adhesive 420 may include an ACF and/or a patterned combination of conductive adhesive structures and nonconductive adhesive structures—e.g., where conductive structures thereof facilitate electrical interconnection of IO contacts 432, 434 of multilayer circuit 430 each to a respective trace at surface portion 412. Alternatively or in addition, conductive adhesive structures may facilitate electrical interconnection of contacts 436, 438 of multilayer circuit 430 each to a respective trace at surface portion 416. By way of illustration and not limitation, multilayer circuit 430 may be bonded to transparent substrate 410 (as shown at stage 402) via adhesive 420 to provide a bridge which interconnects respective traces on surface portions 412, 416. In some embodiments, one or more microelectronic devices may be coupled to multilayer circuit 430—e.g., directly or via transparent substrate 410. For example, as shown at stage 403, microelectronic devices 440, 450 may be coupled to transparent substrate 410 at surface portions 412, 416, respectively.

Figure 5:
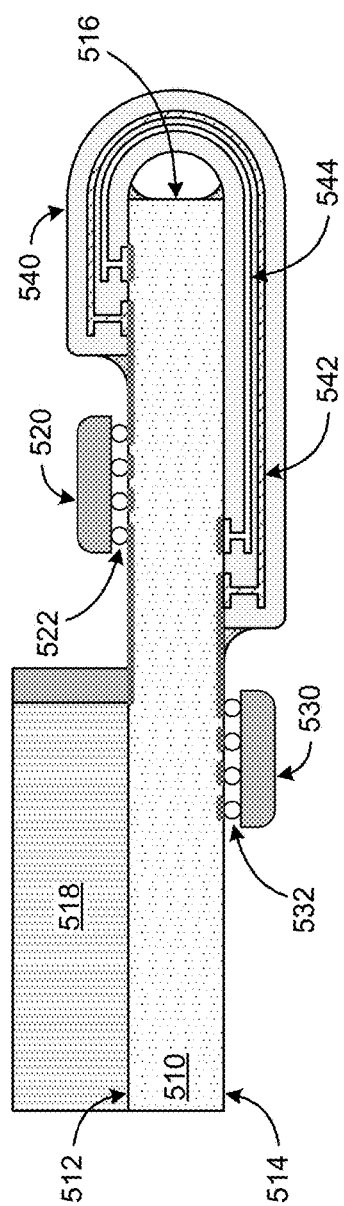
FIG. 5 is a cross-sectional side view of a system to interconnect circuitry on a transparent substrate according to an embodiment.

FIG. 5 illustrates elements of a system 500 to provide interconnect structures on a transparent substrate according to an embodiment. System 500 may include one or more features of system 100, system 300 or the like. In an embodiment, manufacture or operation of system 500 is according to method 200.

In the illustrative embodiment of system 500, transparent substrate 510 has a side 512 on which is bonded a portion of a multilayer circuit 540. An opposite side 514 of transparent substrate 510 has bonded thereon another portion (e.g., an opposite end) of multilayer circuit 540. For example, multilayer circuit 540 may include a flexible circuit that is bent to extend around a side 516 of transparent substrate 510. In an embodiment, multilayer circuit 540 interconnects microelectronic devices which are variously disposed on the opposite respective sides 512, 514 of transparent substrate 510. By way of illustration and not limitation, microelectronic devices 520, 530 of system 500 may be variously adhered or otherwise bonded to sides 512, 514 respectively. In one illustrative embodiment, microelectronic devices 520, 530 provide controller, driver, graphics processor and/or other integrated circuit functionality to operate one or more display elements (such as the illustrative LED display elements 518 shown) that are disposed on substrate 510.

Conductive traces (e.g., including ITO traces) variously disposed on sides 512, 514 may facilitate connection between IO contacts of multilayer circuit 540 to respective hardware interfaces 522, 532 of microelectronic devices 520, 530. Such IO contacts of multilayer circuit 540 may be variously coupled to one another by interconnects including, for example, the illustrative traces 542, 544 shown. In an embodiment, interconnects of multilayer circuit 540 extend at different respective levels, e.g., wherein a portion of trace 544 is closer to transparent substrate 510 than an overlapping portion of trace 542. The multilayer arrangement of such traces may facilitate a longer traces and/or more closely spaced traces, as compared to conventional chip-on-glass interconnect techniques. Alternatively or in addition, such a multilayer arrangement of traces may facilitate shielding (e.g., with a ground or other reference potential) to help protect signal integrity.

Figure 6:
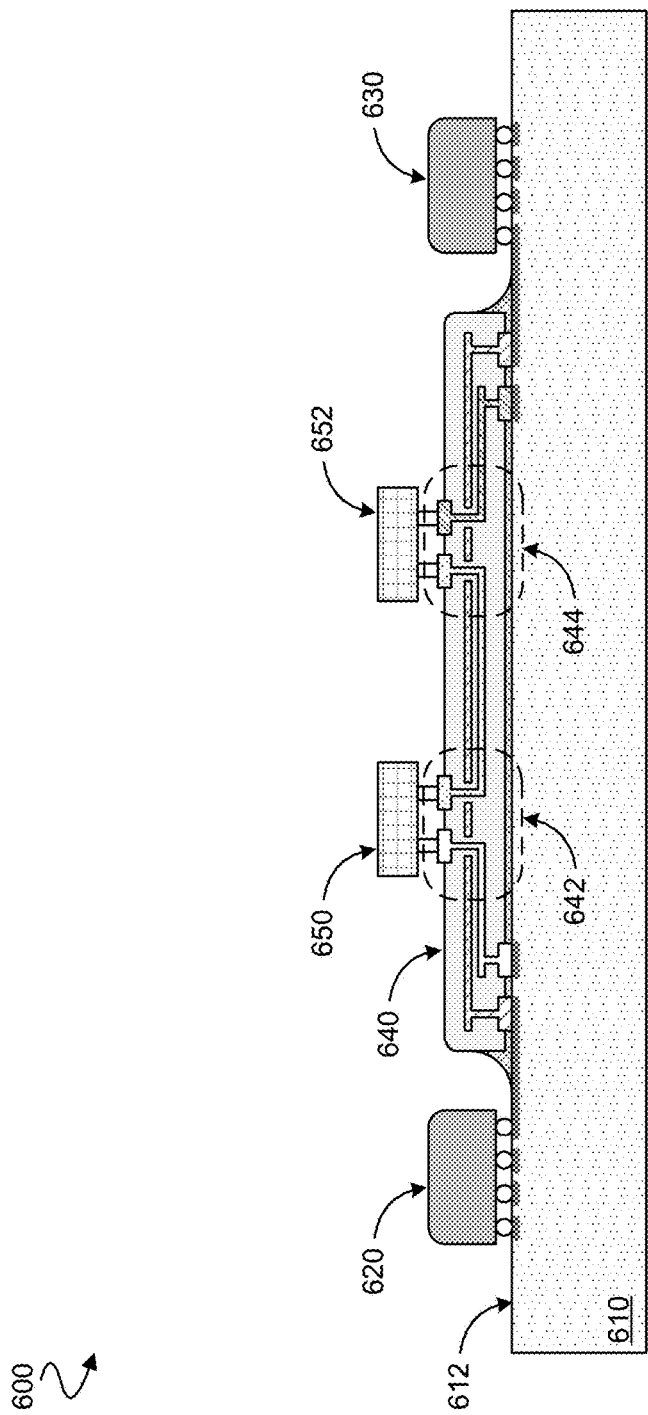
FIG. 6 is a cross-sectional side view of a system to interconnect circuitry with a multilayer circuit according to an embodiment.

FIG. 6 illustrates features of a system 600 to interconnect circuitry on a transparent substrate, according to an embodiment. System 600 may include one or more features of system 100, system 300 or the like. In an embodiment, system 600 is manufactured and/or operated according to method 200.

In the illustrative embodiment shown, a side 612 of a transparent substrate 610 has formed thereon various ITO traces, wherein microelectronic devices 620, 630 and a multilayer circuit 640 of system 600 are coupled to side 612. In another embodiment, microelectronic devices 620, 630 are disposed on opposite sides of transparent substrate 610. IO contacts of multilayer circuit 640 may be variously coupled to respective IO contacts of microelectronic device 620 and microelectronic device 630. In the illustrative embodiment shown, ITO traces patterned on side 612 variously couple respective IO contacts of microelectronic devices 620, 630 each with a corresponding IO contact of multilayer circuit 640. In other embodiments, microelectronic device 620 and/or microelectronic device 630 may instead be mounted directly onto multilayer circuit 640.

In one embodiment, opposite sides of multilayer circuit 640 have respective IO contacts variously disposed therein or thereon. By way of illustration and not limitation, regions 642, 644 may have formed therein respective via structures to variously connect IO contacts each with a respective metallization layer of multilayer circuit 640. Such interconnect structures may provide for coupling of one or more circuit components (such as the illustrative circuit components 650, 652) directly onto multilayer circuit 640. In the illustrative embodiment shown, microelectronic devices 620, 630 are coupled to one another via IO contacts at various sides of multilayer circuit 640, via traces extending in multilayer circuit 640, and via one or both of circuit components 650, 652. Circuit components 650, 652 may include one or more passive circuit elements such as capacitors, inductors and/or the like. Alternatively or in addition, circuit components 650, 652 may include active circuit components—e.g., where circuit components 650, 652 include an IC device.

Figure 7:
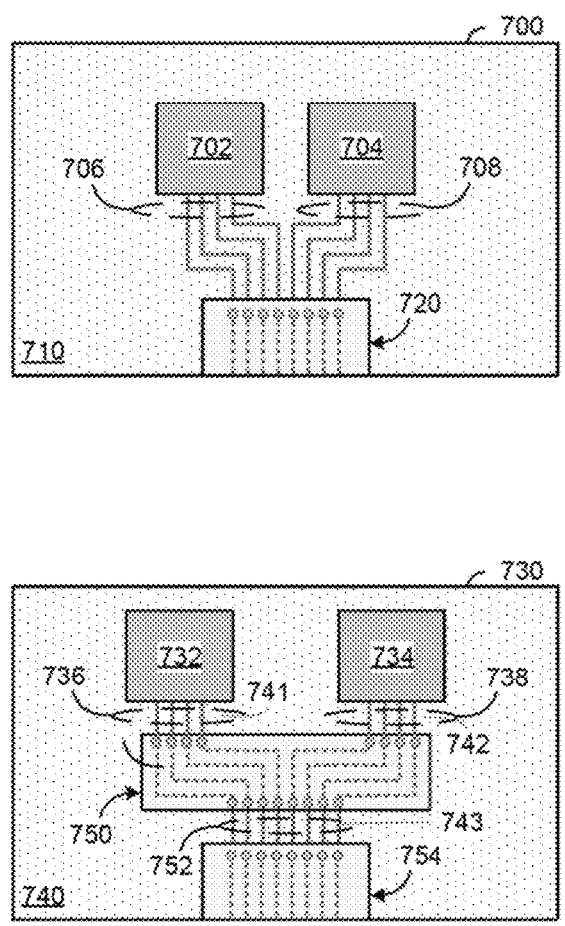
FIG. 7 shows plan views of respective devices including interconnect structures according to an embodiment.

FIG. 7 illustrates various top plan views of devices 700, 730 each to provide respective interconnect structures on a transparent substrate according to a corresponding embodiment. Devices 700, 730 may include respective features of system 100, system 300, system 500, system 600 or the like—e.g., wherein such features are provided according to method 200.

In the illustrative embodiment of the device 700, conductive traces 706, 708 are variously patterned on a side of a transparent substrate 710. Traces 706 may variously extend between IO contacts of a multilayer circuit 720 and IO contacts of a hardware interface 702. Alternatively or in addition, traces 708 may variously extend between other IO contacts of multilayer circuit 720 and IO contacts of a hardware interface 704. In the example embodiment of device 700, multilayer circuit 720 may variously interconnect hardware interfaces 702, 704 each with a respective one or more other microelectronic devices (not shown). For example, multilayer circuit 720 may only indirectly interconnect hardware interfaces 702, 704 with one another via another IC device (not shown) that is disposed on substrate 710. The other IC device may be coupled to multilayer circuit 720 via respective traces that are formed at a surface of substrate 710.

In the illustrative embodiment of device 730, traces 736, 738 are variously patterned on a side of a transparent substrate 740. Furthermore, multilayer circuit 750 and multilayer circuit 754 may be variously bonded each to a side of transparent substrate 740. Traces 736 may variously couple IO contacts of multilayer circuit 750 to a hardware interface 732 disposed on transparent substrate 710—e.g., wherein traces 738 variously couple other IO contacts of multilayer circuit 750 each to a hardware interface 734 on transparent substrate 740. In such an embodiment, the side of transparent substrate 740 has further disposed thereon traces 752 to couple still other IO contacts of multilayer circuit 750 each to a corresponding IO contact of multilayer circuit 754. Accordingly, hardware interfaces 732, 734 may be variously interconnected each to a respective one or more other microelectronic devices (not shown) that are included in, or are to couple to, device 730. Alternatively or in addition, hardware interfaces 732, 734 may be interconnected to one another via multilayer circuit 750 (and, in some embodiments, via multilayer circuit 754).

As shown in FIG. 7, device 730 for interconnecting circuitry comprises a transparent substrate 740, a first multilayer circuit 750 bonded at a surface of the transparent substrate 740. A circuit component 732 is coupled, via first traces 736 at a first surface portion 741 of the transparent substrate 740, to the at least one of the first input/output (IO) contacts of the first multilayer circuit 750. A second circuit component 734 is coupled, via second traces 738 at a second surface portion 742 of the transparent substrate 740, to the at least one of the second IO contacts of the first multilayer circuit 750. As shown in FIG. 7, a second multilayer circuit 754 is bonded at the surface of the transparent substrate 740, the second multilayer circuit 754 coupled to the first multilayer circuit 750 via third traces 752 at a third surface portion 743 of the transparent substrate 740.

In the illustrative embodiments shown by FIG. 7, multilayer circuits are variously shown as having respective footprints which are substantially rectilinear. However, a multilayer circuit bonded to a transparent substrate may have any of a variety of shapes (e.g., one of a T-shape, L-shape, U-shape or the like), in different embodiments. Moreover, one end of multilayer circuit 720 is shown as providing connectivity to two hardware interfaces 702, 704 (where an end of multilayer circuit 750 is shown as providing connectivity to two hardware interfaces 732, 734). However, such a multilayer circuit may provide such connectivity to more, fewer and/or differently arranged hardware interfaces, in different embodiments.

Figure 8:
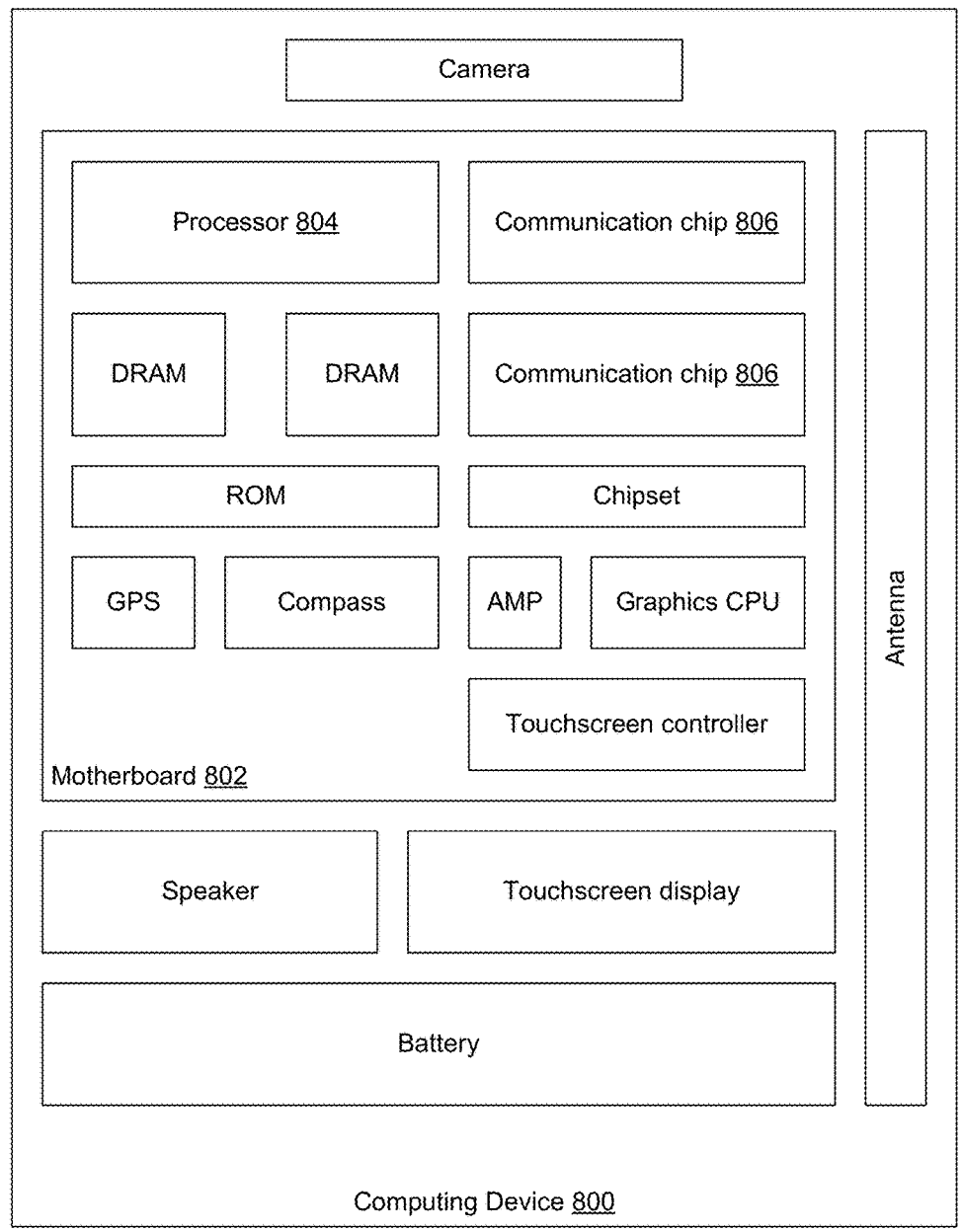
FIG. 8 is a functional block diagram illustrating elements of a computer device according to an embodiment.

FIG. 8 illustrates a computing device 800 in accordance with one embodiment. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. The term "processor" may refer to any device or portion of a device that processes electronic data from registers and/or memory to transform that electronic data into other electronic data that may be stored in registers and/or memory. The communication chip 806 also includes an integrated circuit die packaged within the communication chip 806.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 9:
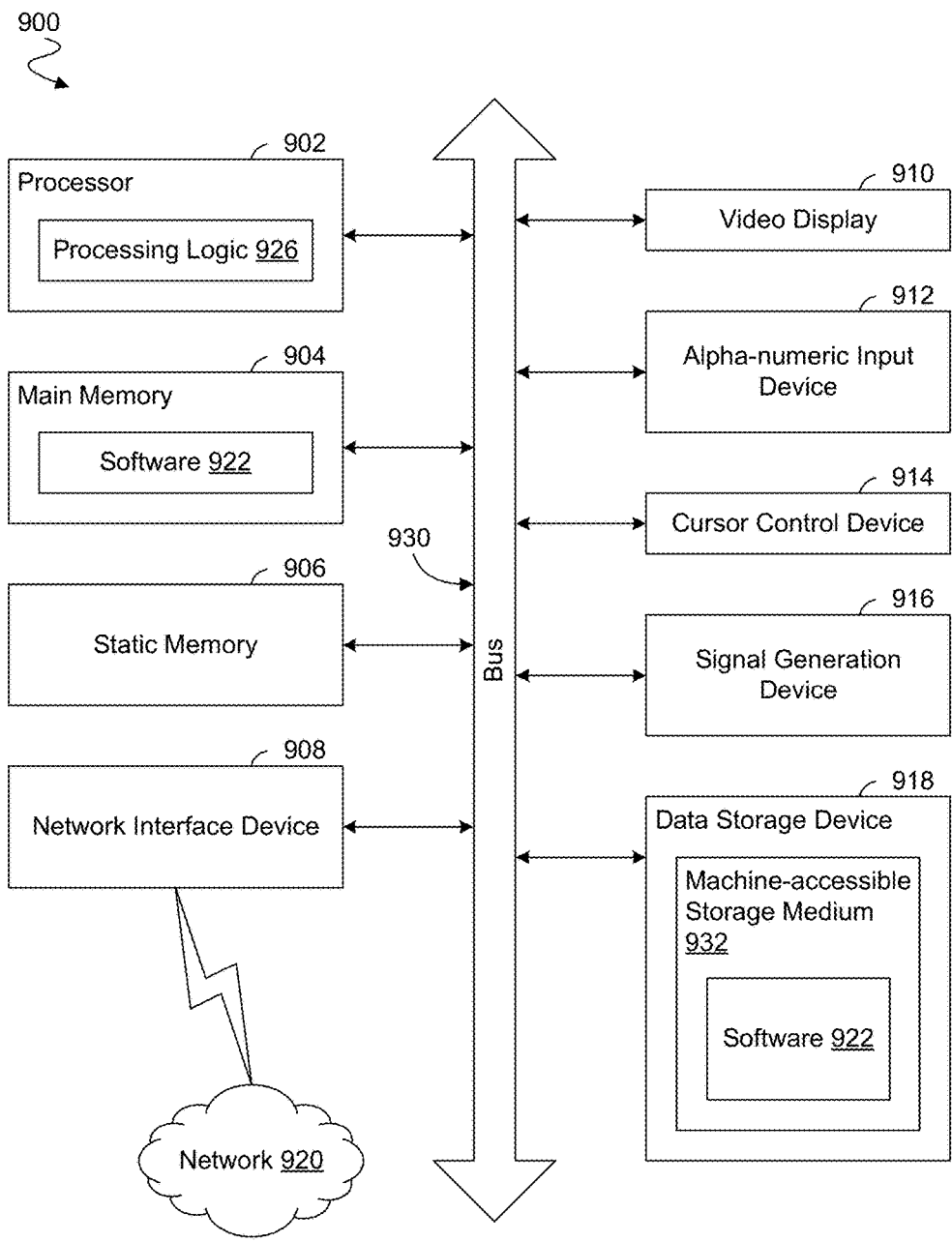
FIG. 9 is a functional block diagram illustrating elements of a computer system according to an embodiment.

FIG. 9 illustrates a diagrammatic representation of a machine in the exemplary form of a computer system 900 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 900 includes a processor 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a secondary memory 918 (e.g., a data storage device), which communicate with each other via a bus 930.

Processor 902 represents one or more general-purpose processing devices such as a microprocessor, central processing unit, or the like. More particularly, the processor 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 902 may also be one or more special-purpose processing devices such as an application specific integrated circuit (ASIC), a field programmable gate array (FPGA), a digital signal processor (DSP), network processor, or the like. Processor 902 is configured to execute the processing logic 926 for performing the operations described herein.

The computer system 900 may further include a network interface device 908. The computer system 900 also may include a video display unit 910 (e.g., a liquid crystal display (LCD), a light emitting diode display (LED), or a cathode ray tube (CRT)), an alphanumeric input device 912 (e.g., a keyboard), a cursor control device 914 (e.g., a mouse), and a signal generation device 916 (e.g., a speaker).

The secondary memory 918 may include a machine-accessible storage medium (or more specifically a computer-readable storage medium) 932 on which is stored one or more sets of instructions (e.g., software 922) embodying any one or more of the methodologies or functions described herein. The software 922 may also reside, completely or at least partially, within the main memory 904 and/or within the processor 902 during execution thereof by the computer system 900, the main memory 904 and the processor 902 also constituting machine-readable storage media. The software 922 may further be transmitted or received over a network 920 via the network interface device 908.

While the machine-accessible storage medium 932 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, a device comprises a transparent substrate, a first multilayer circuit bonded at a surface of the transparent substrate, a first circuit component coupled, via first traces at a first surface portion of the transparent substrate, to first input/output (IO) contacts of the first multilayer circuit, and a second circuit component coupled, via second traces at a second surface portion of the transparent substrate, to second IO contacts of the first multilayer circuit.

In one embodiment, the first surface portion and the second surface portion are on opposite respective sides of the transparent substrate. In another embodiment, the first multilayer circuit includes traces each extending in a body of a flexible dielectric material adhered directly to a surface of the transparent substrate. In another embodiment, the dielectric material comprises a polyamide-imide compound. In another embodiment, the first IO contacts or the second IO contacts are at a first side of the first multilayer circuit, the first multilayer circuit further comprising one or more other IO contacts at a second side of the first multilayer circuit opposite the first side. In another embodiment, the further comprises a third circuit component coupled to the one or more IO contacts, wherein respective ones of the first IO contacts and the second IO contacts are coupled to each other via the third circuit component and the one or more IO contacts. In another embodiment, the device further comprises a second multilayer circuit bonded at the surface of the transparent substrate, the second multilayer circuit coupled to the first multilayer circuit via third traces at a third surface portion of the transparent substrate. In another embodiment, the device further comprises a third circuit component coupled, via third traces at a third surface portion, of the transparent substrate to third IO contacts of the first multilayer circuit, wherein the third circuit component is interconnected with one of the first circuit component and the second circuit component via the first multilayer circuit.

In another implementation, a system comprises a transparent substrate, a first multilayer circuit bonded at a surface of the transparent substrate, a first circuit component coupled, via first traces at a first surface portion of the transparent substrate, to first input/output (IO) contacts of the first multilayer circuit, a second circuit component coupled, via second traces at a second surface portion of the transparent substrate, to second IO contacts of the first multilayer circuit, and one or more display elements disposed on the transparent substrate, the one or more display elements coupled to the first circuit component and the second circuit component to generate a display based on a signal communicated via the first multilayer circuit.

In one embodiment, the first surface portion and the second surface portion are on opposite respective sides of the transparent substrate. In another embodiment, the first multilayer circuit includes traces each extending in a body of a flexible dielectric material adhered directly to a surface of the transparent substrate. In another embodiment, the dielectric material comprises a polyamide-imide compound. In another embodiment, the first IO contacts or the second IO contacts are at a first side of the first multilayer circuit, the first multilayer circuit further comprising one or more other IO contacts at a second side of the first multilayer circuit opposite the first side. In another embodiment, the system further comprises a third circuit component coupled to the one or more IO contacts, wherein respective ones of the first IO contacts and the second IO contacts are coupled to each other via the third circuit component and the one or more IO contacts. In another embodiment, the system further comprises a second multilayer circuit bonded at the surface of the transparent substrate, the second multilayer circuit coupled to the first multilayer circuit via third traces at a third surface portion of the transparent substrate. In another embodiment, the system further comprises a third circuit component coupled, via third traces at a third surface portion, of the transparent substrate to third IO contacts of the first multilayer circuit, wherein the third circuit component is interconnected with one of the first circuit component and the second circuit component via the first multilayer circuit.

In another implementation, a method comprises bonding a first multilayer circuit at a transparent substrate, coupling a first circuit component, via first traces at a first surface portion of the transparent substrate, to first input/output (IO) contacts of the first multilayer circuit, and coupling a second circuit component, via second traces at a second surface portion of the transparent substrate, to second IO contacts of the first multilayer circuit.

In one embodiment, the first surface portion and the second surface portion are coupled to the first multilayer circuit at opposite respective sides of the transparent substrate. In another embodiment, the first multilayer circuit includes traces each extending in a body of a flexible dielectric material adhered directly to a surface of the transparent substrate. In another embodiment, the dielectric material comprises a polyamide-imide compound. In another embodiment, the method further comprises coupling a third circuit component to one or more IO contacts of the first multilayer circuit, wherein respective ones of the first IO contacts and the second IO contacts are coupled to each other via the third circuit component and the one or more IO contacts. In another embodiment, the method further comprises bonding a second multilayer circuit at the surface of the transparent substrate, and coupling the second multilayer circuit to the first multilayer circuit via third traces at a third surface portion of the transparent substrate. In another embodiment, the method further comprises coupling a third circuit component, via third traces at a third surface portion of the transparent substrate, to third IO contacts of the first multilayer circuit, wherein the third circuit component is interconnected with one of the first circuit component and the second circuit component via the first multilayer circuit.

Techniques and architectures for interconnecting circuitry on a transparent substrate are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device for interconnecting circuitry, the device comprising:
   a transparent substrate;
   a first multilayer circuit bonded at a surface of the transparent substrate, the first multilayer circuit comprising a dielectric body, a first interconnect structure extending along a first plane of the dielectric body to at least one of first input/output (IO) contacts, and a second interconnect structure extending along a second plane of the dielectric body to at least one of second IO contacts, wherein the second plane is different from the first plane;
   a first circuit component coupled, via first traces at a first surface portion of the transparent substrate, to the at least one of the first input/output (IO) contacts of the first multilayer circuit; a second circuit component coupled, via second traces at a second surface portion of the transparent substrate, to the at least one of the second IO contacts of the first multilayer circuit; and
   a second multilayer circuit bonded at the surface of the transparent substrate, the second multilayer circuit coupled to the first multilayer circuit via third traces at a third surface portion of the transparent substrate.

2. The device of claim 1, wherein the first multilayer circuit includes traces each extending in a body of a flexible dielectric material adhered directly to a surface of the transparent substrate.

3. The device of claim 2, wherein the dielectric material comprises a polyamide-imide compound.

4. The device of claim 1, further comprising:
   a third circuit component coupled, via third traces at a third surface portion, of the transparent substrate to third IO contacts of the first multilayer circuit, wherein the third circuit component is interconnected with one of the first circuit component and the second circuit component via the first multilayer circuit.

5. A system for interconnecting circuitry, the system comprising:
   a transparent substrate;
   a first multilayer circuit bonded at a surface of the transparent substrate, the first multilayer circuit comprising a dielectric body, a first interconnect structure extending along a first plane of the dielectric body to at least one of first input/output (IO) contacts, and a second interconnect structure extending along a second plane of the dielectric body to at least one of second IO contacts, wherein the second plane is different from the first plane;
   a first circuit component coupled, via first traces at a first surface portion of the transparent substrate, to the at least one of the first input/output (IO) contacts of the first multilayer circuit;
   a second circuit component coupled, via second traces at a second surface portion of the transparent substrate, to the at least one of the second IO contacts of the first multilayer circuit; and
   one or more display elements disposed on the transparent substrate, the one or more display elements coupled to the first circuit component and the second circuit component to generate a display based on a signal communicated via the first multilayer circuit.

6. The system of claim 5, wherein the first multilayer circuit includes traces each extending in a body of a flexible dielectric material adhered directly to a surface of the transparent substrate.

7. The system of claim 6, wherein the dielectric material comprises a polyamide-imide compound.

8. The system of claim 5, further comprising:
   a second multilayer circuit bonded at the surface of the transparent substrate, the second multilayer circuit coupled to the first multilayer circuit via third traces at a third surface portion of the transparent substrate.

9. The system of claim 5, further comprising:
   a third circuit component coupled, via third traces at a third surface portion, of the transparent substrate to third IO contacts of the first multilayer circuit, wherein the third circuit component is interconnected with one of the first circuit component and the second circuit component via the first multilayer circuit.

10. A method for interconnecting circuitry, the method comprising:
    bonding a first multilayer circuit at a transparent substrate, the first multilayer circuit comprising a dielectric body, a first interconnect structure extending along a first plane of the dielectric body to at least one of first input/output (IO) contacts, and a second interconnect structure extending along a second plane of the dielectric body to at least one of second IO contacts, wherein the second plane is different from the first plane;
    coupling a first circuit component, via first traces at a first surface portion of the transparent substrate, to the at least one of the first input/output (IO) contacts of the first multilayer circuit; and
    coupling a second circuit component, via second traces at a second surface portion of the transparent substrate, to the at least one of the second IO contacts of the first multilayer circuit, wherein a second multilayer circuit is bonded at the transparent substrate, the second multilayer circuit coupled to the first multilayer circuit via third traces at a third surface portion of the transparent substrate.

11. The method of claim 10, wherein the first multilayer circuit includes traces each extending in a body of a flexible dielectric material adhered directly to a surface of the transparent substrate.

12. The method of claim 11, wherein the dielectric material comprises a polyamide-imide compound.

13. The method of claim 12, further comprising coupling a third circuit component to one or more IO contacts of the first multilayer circuit, wherein respective ones of the first IO contacts and the second IO contacts are coupled to each other via the third circuit component and the one or more IO contacts.

\* \* \* \* \*